United States Patent [19]
Ames

[11] Patent Number: 5,073,838
[45] Date of Patent: Dec. 17, 1991

[54] METHOD AND APPARATUS FOR PREVENTING DAMAGE TO A TEMPERATURE-SENSITIVE SEMICONDUCTOR DEVICE

[75] Inventor: Stephen J. Ames, Trumansburg, N.Y.
[73] Assignee: NCR Corporation, Dayton, Ohio
[21] Appl. No.: 445,225
[22] Filed: Dec. 4, 1989
[51] Int. Cl.[5] .................................................. H01S 3/00
[52] U.S. Cl. ........................................ 361/103; 372/29; 372/36; 307/310
[58] Field of Search ................. 361/103, 18; 372/29, 372/34, 36, 38, 43; 307/310; 323/907

[56] References Cited
U.S. PATENT DOCUMENTS

| | | | |
|---|---|---|---|
| H332 | 8/1987 | Simons | 372/29 |
| 3,663,897 | 5/1972 | Broom | 332/7.51 |
| 4,243,952 | 1/1981 | Patterson | 331/94.5 S |
| 4,558,465 | 12/1985 | Siegel et al. | 455/609 |
| 4,592,057 | 5/1986 | Comerford | 372/38 X |
| 4,612,671 | 9/1986 | Giles | 455/609 |
| 4,630,278 | 12/1986 | Auffret et al. | 372/43 |
| 4,631,728 | 12/1986 | Simons | 372/38 |
| 4,633,525 | 12/1986 | Eumurian | 455/613 |
| 4,639,606 | 1/1987 | Boles et al. | 250/555 |
| 4,650,347 | 3/1987 | Shigemura et al. | 307/310 X |
| 4,656,635 | 4/1987 | Baer et al. | 372/27 |
| 4,677,632 | 6/1987 | Lisco et al. | 372/38 |
| 4,689,659 | 8/1987 | Watanabe | 357/81 |
| 4,697,270 | 9/1987 | Galkowski | 372/34 |
| 4,725,854 | 2/1988 | Ohtsuka et al. | 272/29 X |
| 4,727,554 | 2/1988 | Watanabe | 372/36 |
| 4,737,798 | 4/1988 | Lonis et al. | 346/1.1 |
| 4,779,161 | 10/1988 | De Shazo, Jr. | 361/103 X |
| 4,924,112 | 5/1990 | Anderson et al. | 307/310 X |

Primary Examiner—Todd E. DeBoer
Attorney, Agent, or Firm—Albert L. Sessler, Jr.

[57] ABSTRACT

A temperature-sensitive semiconductor device, such as a laser diode, is protected against damage from overheating by use of a temperature sensor which produces a signal that is digitized and applied to a microprocessor. The microprocessor uses a look-up table to determine an appropriate duty cycle for operation of the semiconductor device, based upon the temperature of the semiconductor device, so as to avoid operating the semiconductor devices for a length of time which could produce overheating and damage.

28 Claims, 6 Drawing Sheets

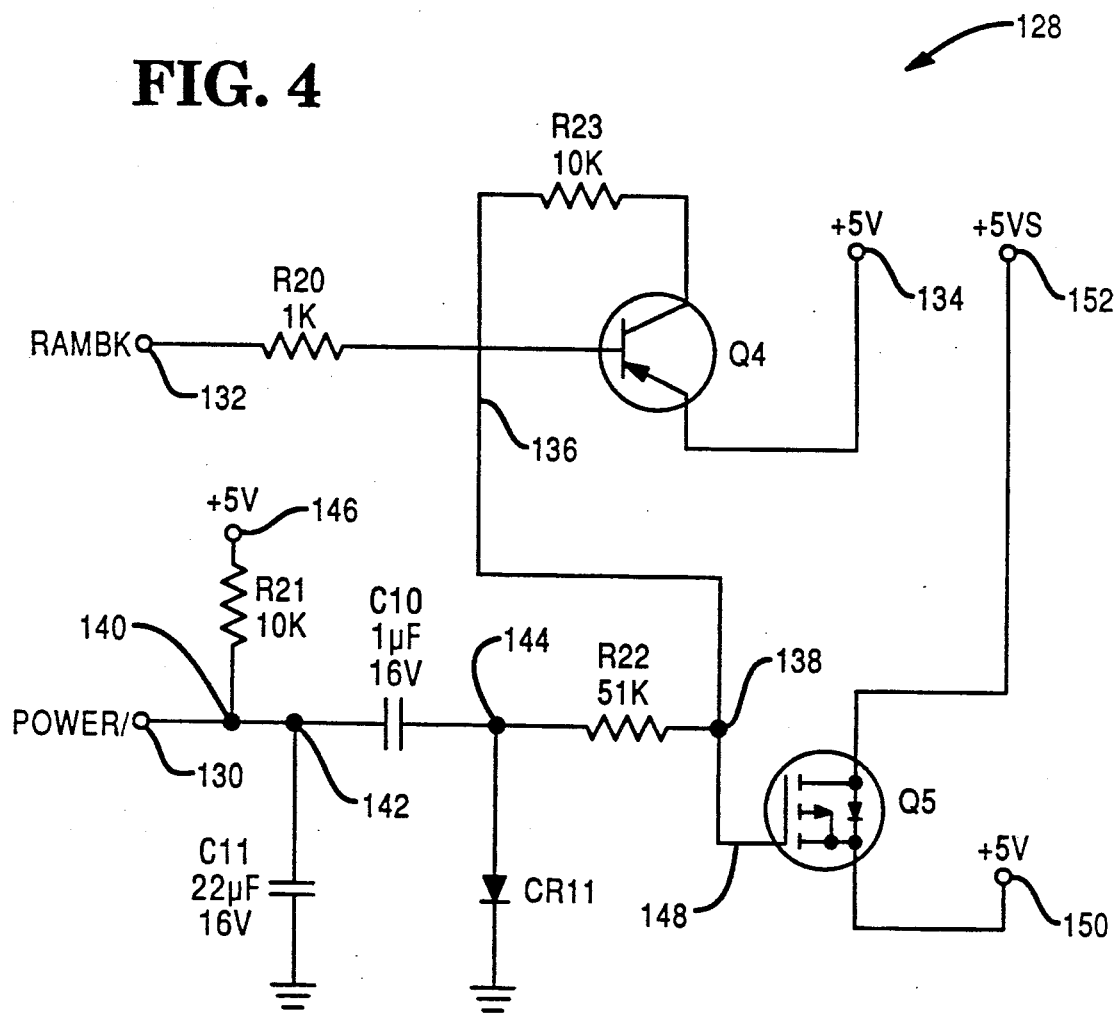

METHOD AND APPARATUS FOR PREVENTING DAMAGE TO A TEMPERATURE-SENSITIVE SEMICONDUCTOR DEVICE

BACKGROUND OF THE INVENTION

This invention relates to a method and apparatus for preventing damage to a temperature-sensitive semiconductor device, and more particularly relates to such a method and apparatus which controls the duty cycle of such a device in order to prevent overheating.

Temperature-sensitive semiconductor devices, such as laser diodes, have come into widespread use in such applications as, for example, fixed and hand-held scanning apparatus used in sensing coded information, such as bar codes, from merchandise items in retail establishments. Laser diodes tend to be very sensitive when exposed to ambient temperatures exceeding their maximum ratings during operation. Because laser diodes do not come equipped with on-board thermal sensing monitors, they are susceptible to irreversible damage in the form of lost laser output. In environments where the external ambient temperatures are high, unprotected laser diode systems are at risk. In most laser drive systems, the overriding concern is to keep the optical power constant through a built-in monitor photodiode. In such an arrangement, however, when a rise in temperature occurs, a loss in optical power induces the drive circuit to provide more current to compensate for the optical loss. Increasing the current drive can only exaggerate the thermal problem and accelerate the demise of the laser diode. Accordingly, there is a need for an effective means to protect an energized laser diode from catastrophic thermal exposure.

SUMMARY OF THE INVENTION

In the present invention, a thermal sensor unit is provided which monitors the temperature of the semiconductor device and provides a signal to a data processor which is capable of altering the mode of operation of the semiconductor device by shutting it down or modifying its duty cycle.

In accordance with a first embodiment of the invention, a thermal monitor for a temperature-sensitive semiconductor device comprises: a heat sink operatively associated with said semiconductor device; driving means for driving said semiconductor device; control means for controlling the operation of said driving means; temperature sensor means mounted in operative relation to said heat sink and capable of providing an analog electrical signal representative of the temperature sensed; analog-to-digital converter means coupled to said temperature sensor means for converting the analog signal to a digital value; and microprocessor means coupled to said analog-to-digital converter means and capable of selecting a proper duty cycle for operation of said semiconductor device, depending upon the temperature of said semiconductor device as given by said digital value, said microprocessor means being coupled to said control means to control said control means to cause said driving means to be operated in accordance with the selected duty cycle.

In accordance with a second embodiment of the invention, apparatus for preventing damage to a laser diode comprises: a heat sink in physical contact with said semiconductor device; driving means for driving said laser diode; a photodiode enclosed in a common envelope with said laser diode for monitoring the light output of said laser diode, said photodiode being coupled to said driving means to control the output of the laser diode; switching means coupled to said driving means for applying and removing power to and from said driving means; temperature sensor means mounted in physical contact with said heat sink, and capable of providing an analog electrical signal representative of the temperature sensed; amplifier means coupled to said temperature sensor means for amplifying the analog electrical signal provided by said temperature sensor means; analog-to-digital converter means coupled to said amplifier means for converting the amplified analog signal to a digital value; and microprocessor means coupled to said analog-to-digital converter means and capable of selecting a proper duty cycle for operation of said laser diode, depending upon the temperature of said laser diode as given by said digital value, said microprocessor means being coupled to said switching means to control said switching means to cause said driving means to be operated in accordance with the selected duty cycle, said microprocessor means also being coupled to said driving means to receive a signal therefrom as to whether or not said laser diode is operating.

In accordance with a third embodiment of the invention, a method for preventing damage to a temperature-sensitive semiconductor device comprises the following steps: (a) measuring the temperature of the temperature-sensitive semiconductor device to obtain temperature data; (b) converting said temperature data to digital form; (c) loading the digital temperature data into a microprocessor; (d) using said digital temperature data in the microprocessor to determine a duty factor; and (e) determining the operating time for said semiconductor device during a cycle by multiplying the total cycle time by the duty factor.

In accordance with a fourth embodiment of the invention, a method for operating a system which utilizes a temperature-sensitive semiconductor device comprises the following steps: (a) applying power to the microprocessor system; (b) carrying out a diagnostic test of the system and indicating a system failure if the system does not pass the test; (c) measuring the temperature of the temperature-sensitive semiconductor device to obtain temperature data; (d) converting said temperature data to digital form; (e) loading the digital temperature data into a microprocessor; (f) using said digital temperature data in the microprocessor to determine a duty factor; (g) determining the operating time for said semiconductor device during a cycle by multiplying the total cycle time by the duty factor; (h) determining whether the system utilizing the semiconductor device has been triggered to an "on" state; (i) if so, generating a power signal to cause said semiconductor device to be operated during that portion of an operating cycle determined by step (g); and (j) determining whether the operating cycle is complete and allowing no retriggering until said cycle has been completed.

It is accordingly an object of the present invention to provide a method and apparatus for preventing damage to a temperature-sensitive semiconductor device.

Another object is to provide a thermal monitor for a laser diode.

Another object is to protect an energized laser from catastrophic thermal exposure.

Another object is to provide a method for operating a system which utilizes a temperature-sensitive semiconductor device.

With these and other objects, which will become apparent from the following description, in view, the invention includes certain novel features of construction and combinations of parts, a preferred form or embodiment of which is hereinafter described with reference to the drawings which accompany and form a part of this specification.

BRIEF DESCRIPTION OF THE DRAWINGS

FIG. 4 is a circuit diagram of a power supply switching circuit.

FIG. 6 is a look-up table.

DETAILED DESCRIPTION

Figure 1:
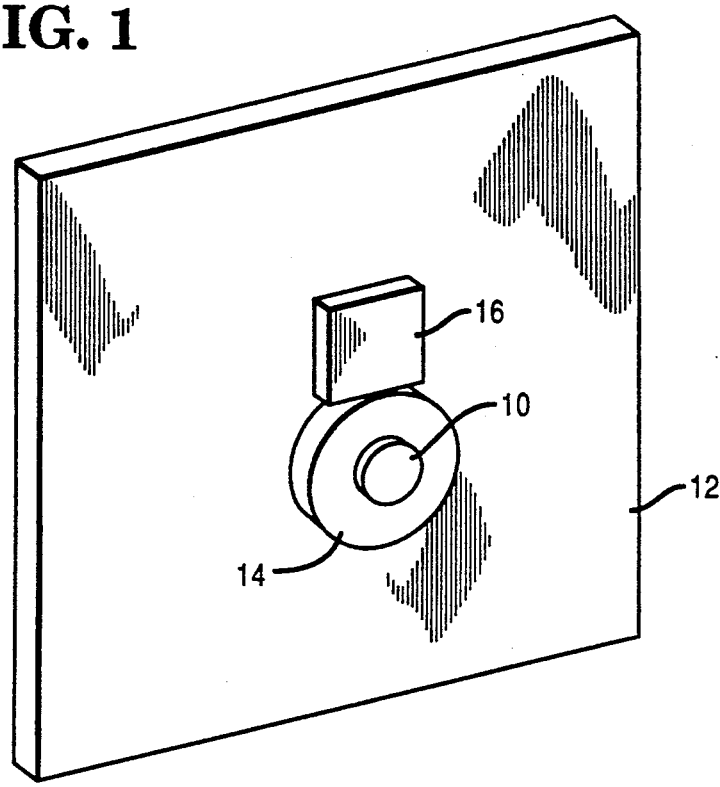
FIG. 1 is a perspective view of a laser diode with a surrounding heat sink and an associated thermal monitor, all mounted on a supporting element.

Referring now to FIG. 1, shown there is a laser diode 10 which is mounted on a supporting element such as a printed circuit board 12. A heat sink 14, which may be of generally annular or doughnut shape, surrounds the laser diode 10, and serves to dissipate the heat generated during operation of said laser diode. A thermal monitor or temperature sensor 16 is secured to the board 12 so that it is in physical contact with the heat sink 14 in order to enable it to monitor the temperature of the heat sink 14, which in turn is dependent upon the temperature of the laser diode 10.

The laser diode 10 is shown in a system represented diagrammatically in FIG. 2, and is powered by a laser driver 18, which is shown in greater detail in FIGS. 3A and 3B, to be subsequently described. The coherent light output of the laser diode 10 is represented in FIG. 2 by the line 20, and may be used for any suitable purpose, such as in a scanning device for scanning bar codes on merchandise items during retail checkout operations.

As will be subsequently be described in greater detail, a monitor photodiode 22 may be packaged integrally with the laser diode 10 and receives light therefrom, as represented by the line 24, which enables it to monitor the output of the laser diode. One such packaged component which includes both a laser diode and a monitor photodiode is model SLD151U, which is available from Sony Corporation of America, Irving, Tex. The monitor photodiode 22 is coupled over a path 26 to the laser driver 18, and it is thereby enabled to exercise a control over the power applied by the driver 18 to the laser diode 10, so that if the light output to the photodiode 22 from the laser diode 10 decreases, the power applied to said laser diode can be increased.

Figure 2:
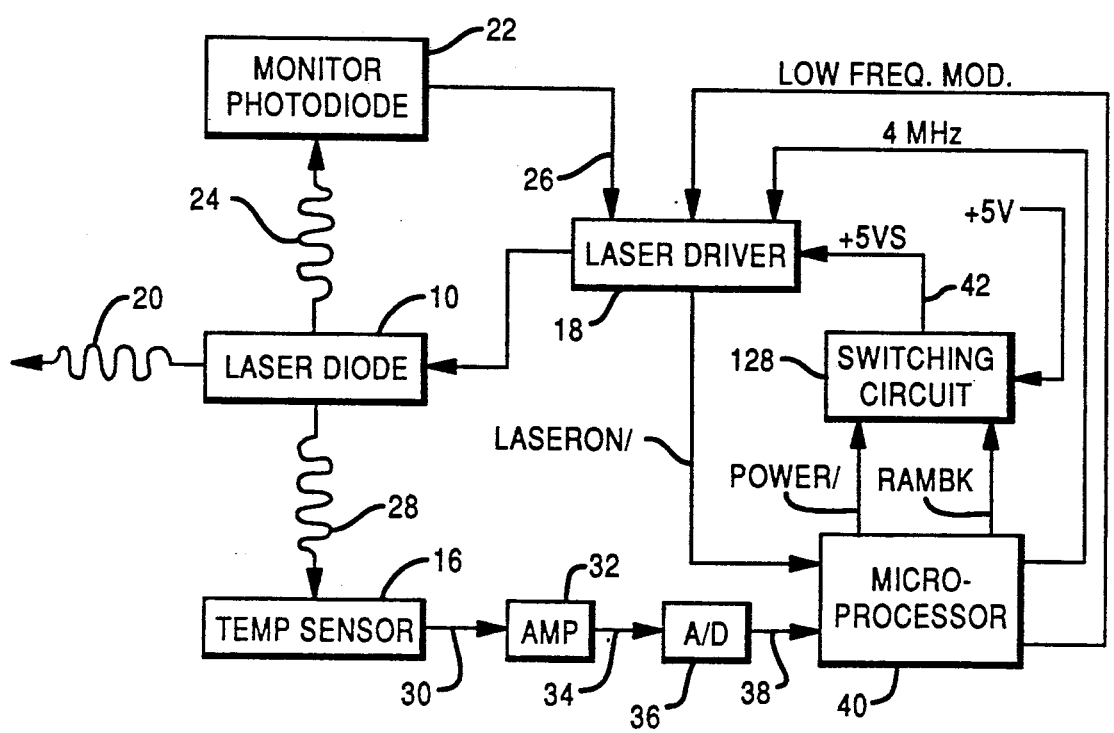
FIG. 2 is a block diagram of the elements of the laser operating system.

As represented by the line 28 in FIG. 2, the temperature sensor 16 senses the temperature of the laser diode 10 as it is operating. The temperature sensor, which may be of type AD592, available from Analog Devices, Norwood, Mass., produces an electrical signal which varies in accordance with the temperature to which the device is subjected. This electrical signal is applied over a path 30 to an amplifier 32, which may be of type 741, available from Analog Devices, which amplifies the signal and applies it over a path 34 to an analog-to-digital converter 36, which may be of type 670, available from Analog Devices. The A/D converter 36 converts the signal to digital form, after which it is passed to a microprocessor 40, which may be of type 80C51, available from Intel Corporation, Santa Clara, Calif. In a manner which will subsequently be described in greater detail, the microprocessor 40 utilizes the digital information from the A/D converter 36 to determine an appropriate duty cycle for operation of the laser diode 10 to prevent its being damaged by excessive heat. A POWER/ signal and a RAMBK signal are generated by the microprocessor 40 and are applied to a power circuit 128 which provides power to the laser driver 18 via a path 42. The POWER/ and RAMBK signals control the power control circuit 128 to cause the laser diode 10 to be energized for only that portion of its total cycle time which will enable it to continue to operate without damage. The microprocessor 40 also applies 4 MHz and low frequency modulation signals directly to the laser driver 18, and receives a LASERON/ signal from said laser driver to indicate the current state of said laser diode; that is, whether it is lasing or not.

Figure 3A:
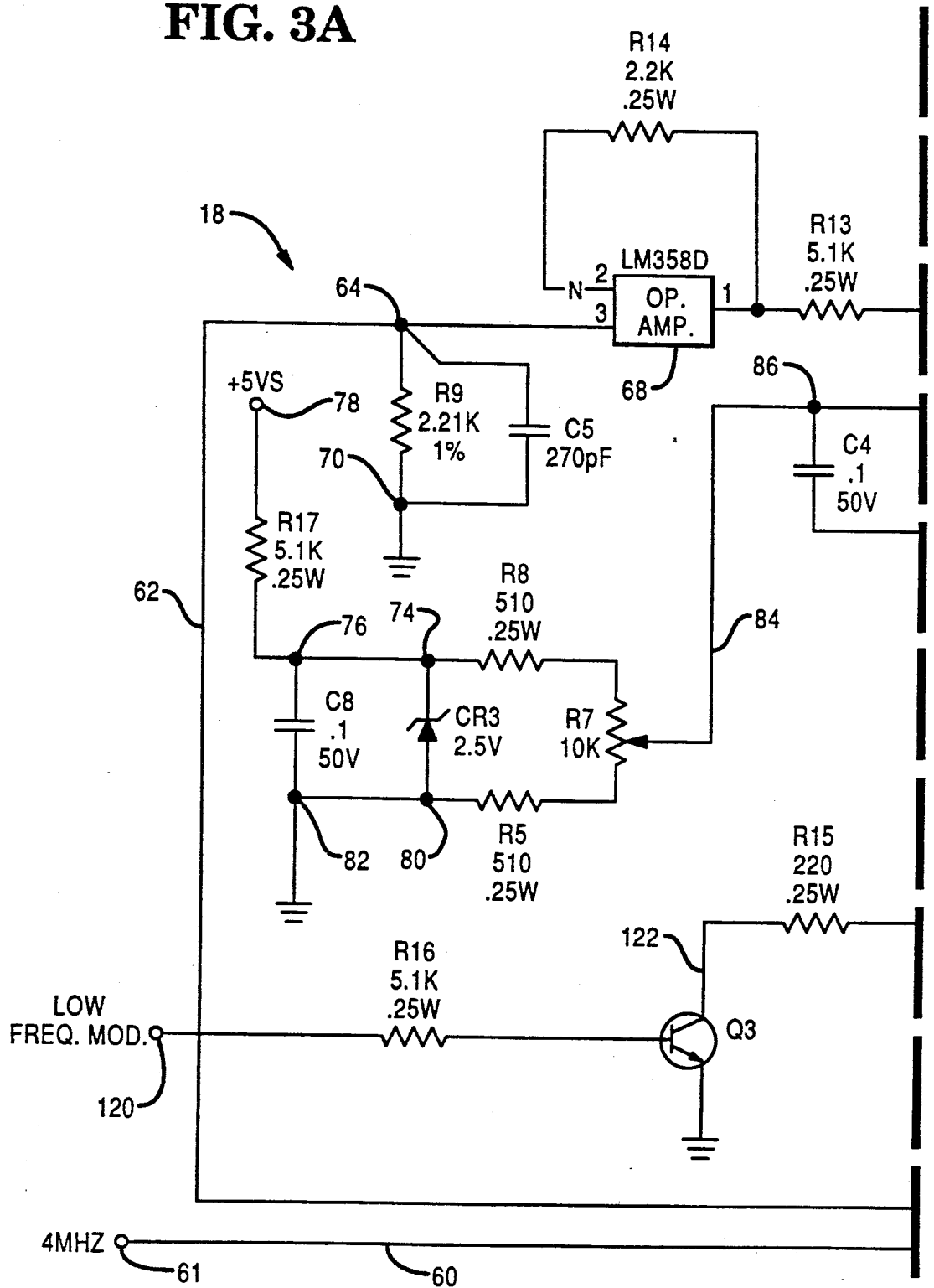
FIGS. 3A and 3B, taken together, constitute a circuit diagram of the laser driver circuit.
Figure 3B:
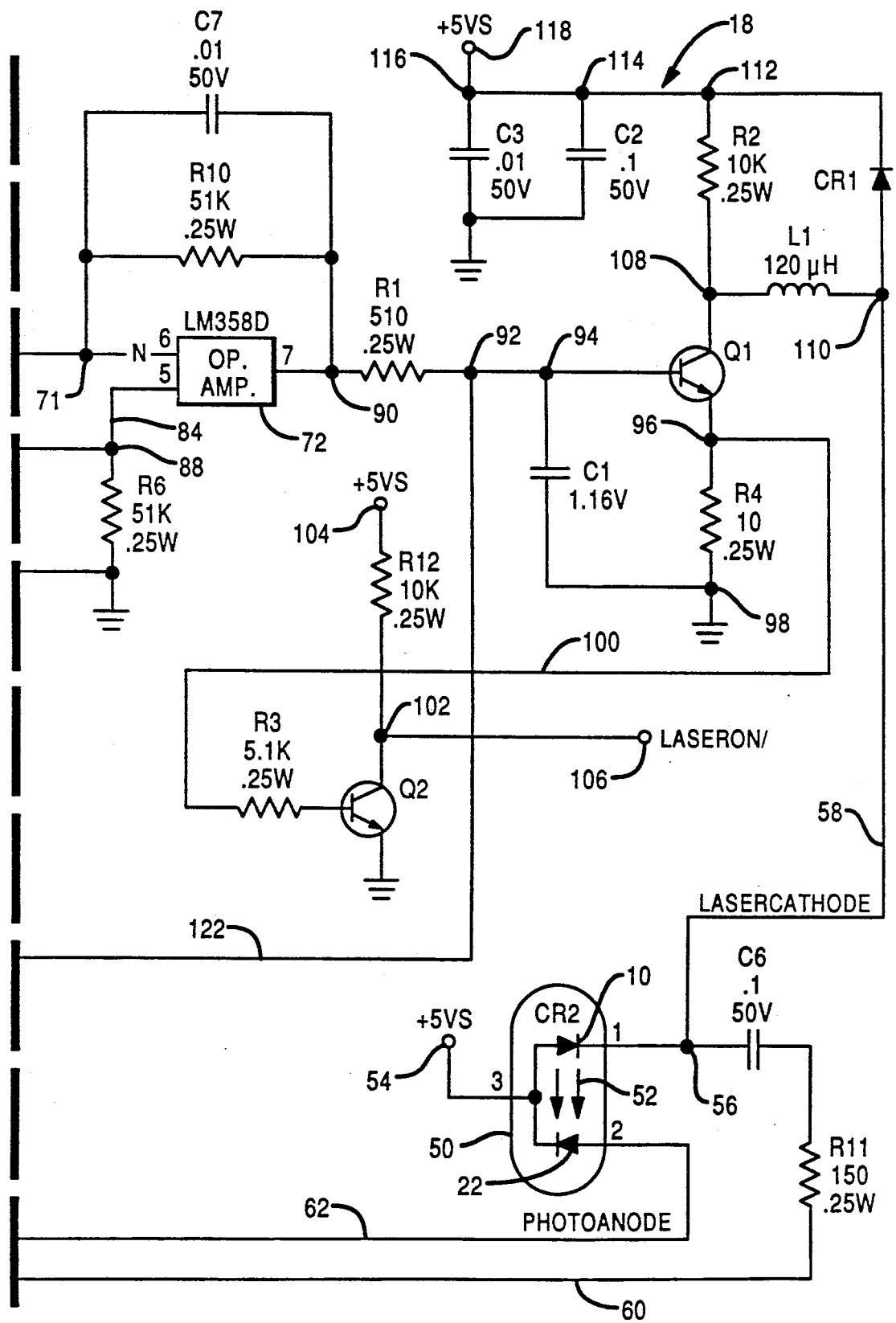

FIGS. 3A and 3B, taken together, show a detailed circuit diagram for the laser driver 18. FIG. 4, which will be subsequently described, is also associated with the laser driver 18 and shows the circuit 128 for controlling the power supplied to the laser driver 18 in response to POWER/ and RAMBK signals from the microprocessor 40. As previously mentioned, the laser 10 and the monitor photodiode 22 are packaged in a single envelope 50, also designated as CR2. Laser power is emitted in equal but opposite directions from the diode 10, one direction being out of the package for external use, and the other being directed against the photodiode 22, as indicated by the arrows 52. The photodiode 22 provides feedback, in which the current generated is proportional to the light power received, in order to maintain constant laser power out of the package while the laser diode 10 is operating.

Power for the laser diode 10 is supplied by a circuit which extends from a +5-volt supply 54 through the laser diode 10 to a node 56. From the node 56, one conductor 58 extends to the collector of a transistor Q1, as will be subsequently be described, and a second conductor 60 extends through a capacitor C6 and a resistor R11 to a terminal 61 to which is applied a 4 MHz signal which is used to modulate the laser diode 10 at high frequency, and which does not form part of the present invention.

The cathode of the photodiode 22 is coupled to the +5-volt terminal 54, and its anode is coupled to a conductor 62 which extends through node 64 to one input of an operational amplifier 68 which may be one half of a dual operational amplifier device of type LM358, available from National Semiconductor Corporation, Santa Clara, Calif. A resistor R9 is connected between the node 64 and a node 70. A capacitor C5 is connected between the node 64 and the node 70, which is also connected to ground. The resistor R9 and the capacitor C5 provide a time constant to regulate the timing of signal changes from the diode 22 with respect to alteration of the power applied to the laser diode 10.

The second input of the operational amplifier 68 is connected over a feedback path from the output of said amplifier which includes a resistor R14. The circuitry including the amplifier 68 comprises an amplifier stage which provides a current to voltage transformation and has a low output impedance that drives into a high impedance input of the next amplifier.

The output is also connected through a resistor R13 and a node 71 to one input of a second operational amplifier 72 which is included in a second amplifier stage that is a gain stage providing a "times ten" gain of voltage from input to output. The amplifier 72 may be the second half of a dual operational amplifier device of type LM358. The other input of the operational amplifier is connected to a reference voltage by means of a circuit which includes a precision voltage reference device CR3, which may be of type LM385, available from National Semiconductor Corporation. The device CR3 is connected at one side through nodes 74 and 76 and a resistor R17 to a +5-volt supply 78, and is connected at its other side through nodes 80 and 82 to ground. A high-frequency bypass capacitor C8 is connected between the nodes 76 and 82. A series combination of a resistor R5, a potentiometer R7 and a resistor R8 is connected between the nodes 80 and 74. The resistors R5 and R8 are limiting resistors which make it impossible to operate the potentiometer R7 to provide a voltage at ground or as high as 2.5 volts. The movable element of the potentiometer R7 is connected via a conductor 84 and nodes 86 and 88 to the second input of the operational amplifier 72. A capacitor C4 is connected between the node 86 and ground. A resistor R6 is connected between the node 88 and ground.

The output of the amplifier 72 is connected through a node 90 and a feedback path including a parallel combination of a resistor R10 and a high-frequency bypass capacitor C7 to the node 71 which is connected to the first input of said amplifier. From the node 90, the output of the amplifier 72 also extends through a resistor R1 and nodes 92 and 94 to the base of an NPN transistor Q1 which may be of type MMBT2222A, available from Motorola Semiconductor Products Inc., Phoenix, Ariz. The emitter of the transistor Q1 is connected through a node 96, a resistor R4 and a node 98 to ground. A capacitor C1 is connected between the nodes 94 and 98. The resistor R1 and the capacitor C1 provide a time constant which is about 100 times longer than the R9, C5 time constant. This prevents oscillation in the circuit.

The node 96 is connected by a conductor 100 and a resistor R3 to the base of an NPN transistor Q2, which may be of type MMBT2222A. The emitter of said transistor is connected to ground, and the collector of said transistor is connected through a node 102 and a resistor R12 to a +5-volt supply 104. The node 102 is connected to a signal output terminal 106 on which a signal LASERON/ may appear, to indicate whether or not the laser 10 is turned on. This signal may be used by the microprocessor 40 in exercising its system control functions, and may also be used to provide an indication to an observer as to whether or not the laser diode is currently turned on.

The collector of the transistor Q1 is connected through a node 108, an inductance L1 of 120 microhenries, available from TDK Company of Japan, and a node 110 to the conductor 58 which is connected to the node 56 in the cathode circuit of the laser diode 10. The inductance L1 prevents the excessively fast injection of current to the laser diode 10 through the transistor Q1. From the node 108, a circuit path extends through a resistor R2 and nodes 112, 114 and 116 to a +5-volt supply 118. Two capacitors C2 and C3 are connected in parallel between the nodes 114 and 116, respectively, and ground. The +5-volt supply 118, the resistor R2 and the capacitors C2 and C3 provide a biasing network for the transistor Q1. A diode CR1, which may be of type FDSO1501, available from Hewlett-Packard Company, Palo Alto, Calif., is connected between the nodes 110 and 112, and allows inductive kickback from the inductance L1 to be shunted away from the laser diode to the +5-volt power supply 118.

A low-frequency modulating signal, which does not form part of the present invention, is applied to terminal 120, which terminal is connected through a resistor R16 to the base of an NPN transistor Q3, which may be of type MMBT2222A. The emitter of the transistor is connected to ground and the collector of said transistor is connected through a resistor R15 and a conductor 122 to the node 92 in the base circuit of the transistor Q1. The signal applied to the terminal 120 is thus capable of affecting the base to emitter current of the transistor Q1, which in turn affects the collector-emitter current of the transistor Q1, and thus the current through the conductor 58, which is applied to the laser diode 10 in the envelope CR2. The signal applied to the terminal 120 can cause the laser 10 to shift between a lasing mode and an LED (light emitting diode) mode.

Shown in FIG. 4 is a power control or switching circuit 128 which is capable of turning power on and off to the laser drive circuit 18 of FIGS. 3A and 3B in response to a POWER/ signal from the microprocessor 40 which is applied to terminal 130 of FIG. 4. A second signal, designated as RAMBK, is also controlled by the microprocessor 40, and works in concert with the POWER/ signal.

The RAMBK signal is applied from the terminal 132 through a resistor R20 to the base of a PNP transistor Q4 which may be of type 2N3906, available from Motorola Semiconductor Products Inc., to control conduction through said transistor. The emitter of the transistor Q4 is connected to a +5-volt supply 134, and the collector of the transistor Q4 is connected through a resister R23 and a conductor 136 to a node 138.

The POWER/ signal is applied from the terminal 130 through nodes 140 and 142, a capacitor C10, a node 144 and a resistor R22 to the node 138. A path extends from a +5-volt supply 146 through a pull-up resistor R21 to the node 140. The node 142 is connected to ground through a capacitor C11. The node 144 is connected to ground through a diode CR11, which may be of type FDSO1501, available from Hewlett-Packard Company.

From the node 138, a path 148 extends to the gate of a power MOSFET transistor Q5, which may be of type IRFD9020, which is available from International Rectifier, El Segundo, Calif. The source of the transistor Q5 is connected to a +5-volt supply 150, and the drain of said transistor is connected to a terminal 152, from which a +5-volt supply is coupled to all +5-volt supply terminals in FIGS. 3A and 3B, and constitutes the supply for them.

In operation, the circuit of FIG. 4 customarily resides in the laser driver printed circuit board and acts under control of the microprocessor 40 to supply power to the circuit of FIGS. 3A, 3B, and thus controls the functioning of the laser drive 18. Let it first be assumed that the MOSFET transistor Q5 of FIG. 4 is not conducting, so that the +5-volt supply voltage is not being applied to the various +5-volt supply terminals of FIGS. 3A and 3B. The signals RAMBK and POWER/ are both at a high logic level of +5 volts. To turn on the transistor Q5, the signal RAMBK is left at a high logic level, and the POWER/ signal is switched to a low logic level of 0 volts. Since the signal RAMBK stays at a high level, the transistor Q4 remains off, and there is no conduction therethrough from the +5-volt terminal 134 to the node 138. Switching of the POWER/ signal to its low level of 0 volts causes the potential at the node 138 and the gate of the transistor Q5 to go to −5 volts, due to the charge inversion effect from the capacitor C10 in combination with the diode CR11. This change in potential level to −5 volts at the gate of the transistor Q5 makes the channel resistance between source and drain relatively small and causes it to go full on, whereas a change to 0 volts would not have the same effect due to the larger source-drain channel resistance.

The MOSFET transistor Q5 will now continue to conduct, so that power is supplied to the laser drive circuit of FIGS. 3A and 3B, so long as the levels of the signals RAMBK and POWER/ remain unchanged. When it is desired to interrupt power to the laser drive circuit 18, the POWER/ signal is first switched to a high logic level, which removes the −5-volt potential from the gate of the transistor Q5. Immediately afterward, the RAMBK signal is switched to a low level, which causes the transistor Q4 to conduct, and immediately puts a +5-volt potential level at the gate of the transistor Q5, causing the transistor Q5 immediately to terminate conduction, thereby interrupting power to the supply voltage terminals of the laser drive circuit 18. Once the gate of the transistor Q5 goes to a +5-volt level, the RAMBK signal can return to its high logic level of +5 volts, in preparation for the next operation which causes the transistor Q5 to commence conducting once again.

Referring now to the operation of the laser driver circuit shown in FIGS. 3A, 3B, the laser diode 10 is turned on and is caused to lase by the application of current thereto. The laser driver circuit, once triggered, provides the current necessary to stimulate a predetermined laser power. As previously noted, part of the light output of the laser is directed to the photodiode 22, which generates a corresponding current to provide a feedback function to maintain constant laser power out of the package 50 during the on cycle of the laser.

The output of the photodiode 22 is applied via conductor 62 to one input of the operational amplifier 68, which amplifies the current from the diode 22 and applies it to one input of the second operational amplifier 72. The other input of the amplifier 72 is coupled to a reference voltage established by the precision reference voltage device CR3 and associated circuitry, which provides a 2.5-volt potential to said input. If the signal applied to the other input of the amplifier 72 is less than the reference voltage, the output of the amplifier 72 will increase in drive current, which is applied to the base of the transistor Q1. The transistor Q1 reacts to the increase in drive current by providing an increased current in its collector circuit, which is applied over the conductor 58 to the laser diode 10, causing said laser diode to generate an increased amount of light. The photodiode 22 senses the increased light and converts it to an equivalent increase in current, which is applied to that input of the amplifier 68 which is coupled to the conductor 62. The amplifier 68 continues to drive the amplifier 72, which continues to drive the laser diode 10 through the transistor Q1. When the light from the laser diode 10 is sufficient that the input to the amplifier 72 from the amplifier 68 equals the reference voltage applied to the other input of the amplifier 72, the current stabilizes and remains at a given level for a given temperature. The laser output light power is thus stabilized.

If the ambient temperature now increases, the laser diode 10 becomes less capable of producing the same amount of light, and the feedback circuit described above will cause a greater current to be applied to the laser diode. If the temperature continues to increase, there is a point at which the driver circuit 18 cannot continue to produce greater current. If the laser diode temperature increases to above 50 degrees C., the laser diode will be damaged. Higher temperatures will accelerate the damage.

The temperature sensor 16, as has been described, detects the temperature of the laser diode 10, and generates a signal which is proportional to the temperature. This signal is amplified by the amplifier 32, converted to a digital value by the D/A converter 36, and utilized in its digital form by the microprocessor 40, as will subsequently be described, to provide POWER/ and RAMBK signals. These signals are capable of controlling the operation or duty factor of the laser diode 10 to prevent it from reaching excessive temperatures which could result in damage thereto.

Figure 5A:
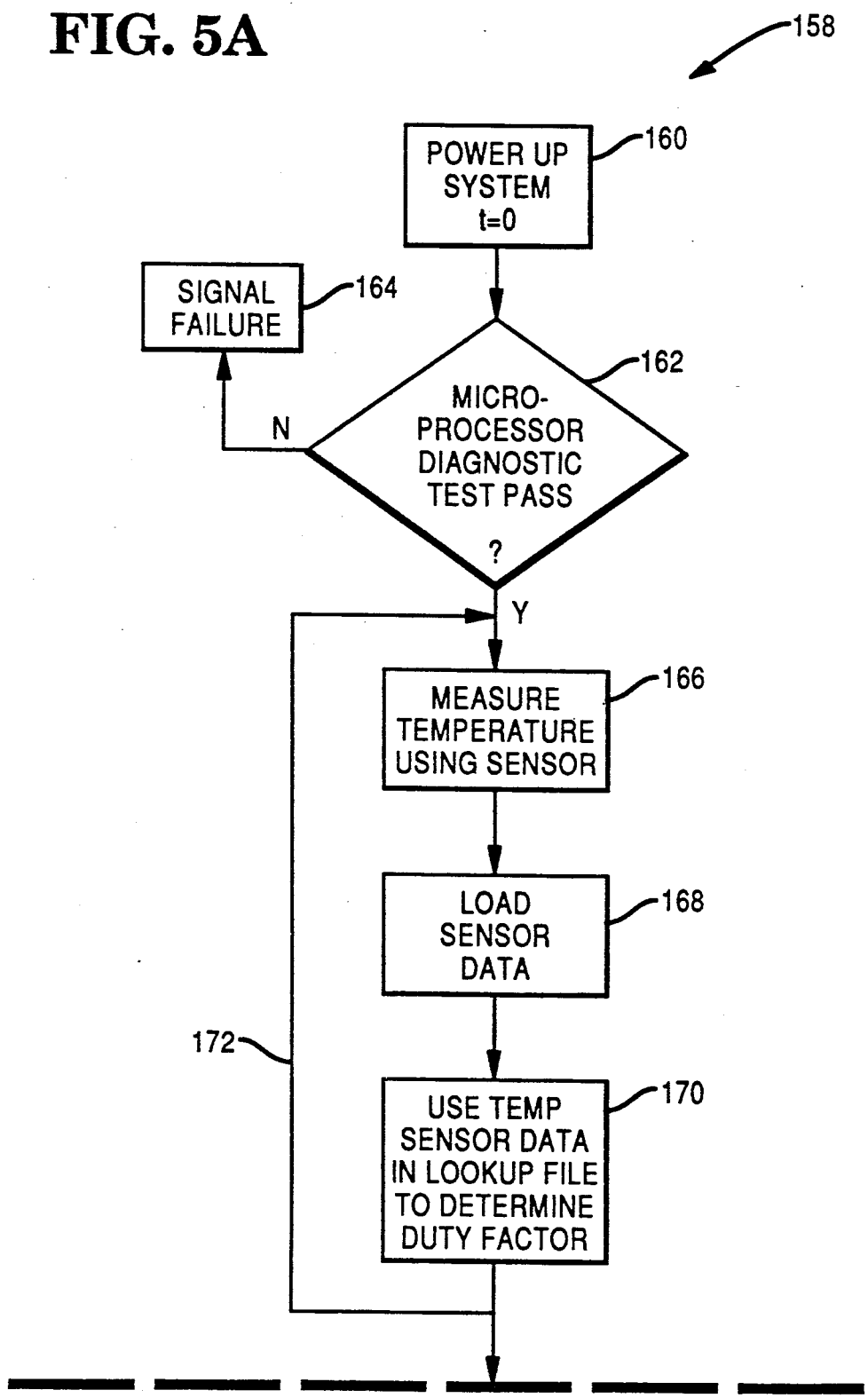
FIGS. 5A and 5B, taken together, constitute a flow diagram of a process for operating the laser diode.
Figure 5B:
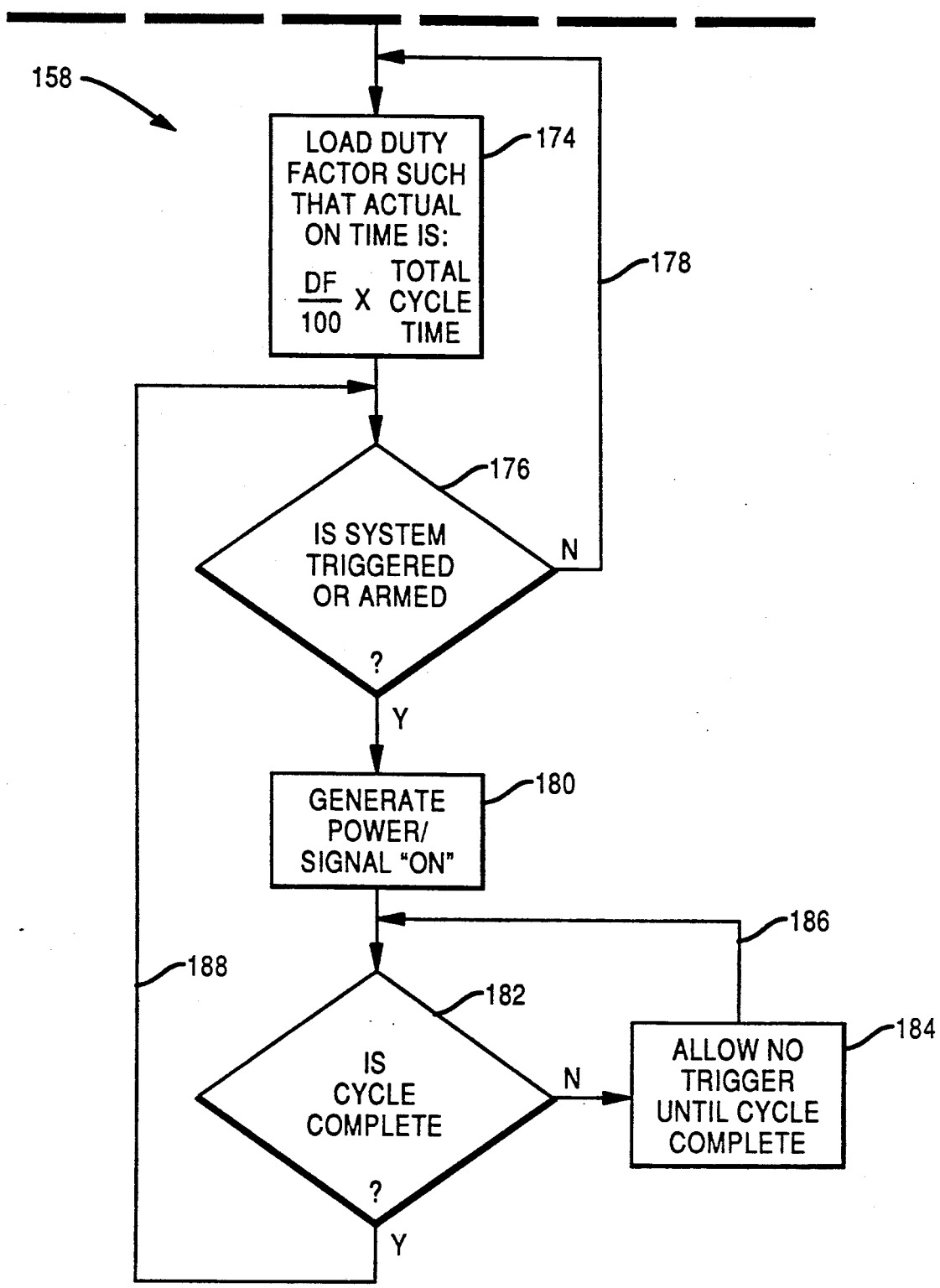

Shown in FIGS. 5A and 5B is a flow diagram representing the process 158 by which the microprocessor 40 determines the timing for the POWER/ and RAMBK signals which are applied to the terminals 130 and 132 of the circuit of FIG. 4. As previously noted, the circuit of FIG. 4 controls the application of power to the laser driver circuit of FIGS. 3A, 3B. The logic levels of the POWER/ signal and the RAMBK signal are changed in accordance with a selected duty cycle which is determined to be appropriate for the laser diode 10 in order to avoid possible overheating of, and damage to, said laser diode.

The process is initiated by powering up the microprocessor system, as represented by block 160 in FIG. 5A. The microprocessor 40 is then put through a standard diagnostic test, as represented by block 162, and provides a signal indicating failure (block 164) if the test is not passed.

Assuming that the test is passed, the process continues to block 166, in which the temperature of the laser diode 10 is measured by the temperature sensor 16. The temperature sensor data is amplified by the amplifier 32 and converted to a digital value by the A/D converter 36, as previously discussed in connection with FIG. 2. The resulting digital data is then loaded into the microprocessor 40 as represented in block 168.

In the microprocessor 40, the digital temperature data is used (block 170) to access a look-up table 200, such as is shown in FIG. 6. The look-up table 200 is located in memory associated with the microprocessor 40, and contains several ranges of temperature, with a laser diode duty factor associated with each range. Thus, for example, a temperature value of 38 degrees C. falls within the range of 36-40 degrees C., for which the corresponding duty factor is 50%. It will be noted that if the sensed temperature is at 30 degrees C. or below, a duty factor of 100% is provided, which means that the laser diode 10 can remain on during an entire cycle of operation, without danger of damage caused by overheating. On the other hand, if the sensed temperature is 51 degrees C. or higher, a duty factor of 0% is provided, and the laser diode 10 is not allowed to operate until its temperature cools down to 50 degrees or below. The duty factor scale is an example only and may be altered to suit any particular laser diode.

The portion of the process which includes the blocks 166, 168 and 170 is periodically repeated, as indicated by the path 172, in order to obtain periodically updated and current temperature readings so that the duration of "on" time for the laser diode 10 can be altered as appropriate.

Once the appropriate duty factor has been ascertained, the actual "on" time for the POWER/ and RAMBK signals is determined, as represented by block 174 (FIG. 5B), by multiplying the duty factor, divided by 100, by the total cycle time of the laser diode 10 in the utilizing device in which it is incorporated.

The process 158 continues to decision block 176, in which a determination is made as to whether the system in which the laser diode 10 is used has been triggered or armed. In the case of a hand-held scanner, for example, this would normally involve the operation of a lever or trigger to initiate an operation for sensing of a bar code on an article of merchandise. If the system is not triggered or armed at that time, the process returns over path 178 to load another duty factor, to update the actual "on" time to be used. If the system is triggered, however, the logic level change for the POWER/ signal is generated by the microprocessor 40, as represented by the block 180.

Following the logic level change of the POWER/ signal, a determination is made in block 182 as to whether the operating cycle of the utilizing device is complete. If said cycle is not yet complete, the process loops through the block 184, which prevents retriggering of the scanner or other device until the cycle is complete, and through the path 186, until the cycle has been completed. Once the cycle has been completed, the process returns via the path 188 to the block 176 in preparation for the next operation of the system.

It will thus be seen that the process 158 of FIGS. 5A and 5B provides a means for altering the logic levels of the POWER/ and RAMBK signals, for controlling the operation of the laser driver circuit 18, which is dependent upon the temperature of the laser diode 10, and which can alter the portion of time during which the laser diode can operate during an operating cycle of the utilizing device, so as to prevent damage to the laser diode from overheating.

While the form of the invention shown and described herein is admirably adapted to fulfill the objects primarily stated, it is to be understood that it is not intended to confine the invention to the form or embodiment disclosed herein, for it is susceptible of embodiment in various other forms within the scope of the appended claims.

What is claimed is:

1. A thermal monitor for a temperature-sensitive semiconductor device, comprising:
   a heat sink operatively associated with said semiconductor device;
   driving means for driving said semiconductor device;
   control means for controlling the operation of said driving means;
   temperature sensor means mounted in operative relation to said heat sink and capable of providing an analog electrical signal representative of the temperature sensed;
   analog-to-digital converter means coupled to said temperature sensor means for converting the analog signal to a digital value; and
   microprocessor means coupled to said analog-to-digital converter means and capable of selecting a proper duty cycle for operation of said semiconductor device, depending upon the temperature of said semiconductor device as given by said digital value, said microprocessor means being coupled to said control means to control said control means to cause said driving means to be operated in accordance with the selected duty cycle.

2. The thermal monitor of claim 1, in which the semiconductor device is a laser diode.

3. The thermal monitor of claim 2, in which the laser diode includes a light-monitoring device to maintain the laser diode at a constant output.

4. The thermal monitor of claim 3, in which the light-monitoring device is coupled to the driving means to enable said device to control the output of the laser diode.

5. The thermal monitor of claim 3, in which the light-monitoring device comprises a photodiode.

6. The thermal monitor of claim 5, in which said photodiode is enclosed in a common envelope with said laser diode.

7. The thermal monitor of claim 1, in which said temperature sensor means is positioned in engagement with said heat sink.

8. The thermal monitor of claim 1, also including amplifier means coupled between said temperature sensor means and said analog-to-digital converter means for amplifying the current produced by said sensor and applying it to said analog-to-digital converter means.

9. The thermal monitor of claim 1, in which said control means comprises switching means for applying and removing power to and from said driving means.

10. The thermal monitor of claim 9, in which said switching means includes a MOSFET device.

11. The thermal monitor of claim 1, in which the microprocessor means includes a look-up table which includes a plurality of temperature ranges and corresponding duty cycle values for selecting a duty cycle based upon the temperature data provided by the analog-to-digital converter means to the microprocessor means.

12. The thermal monitor of claim 1, in which said heat sink is of generally annular configuration and is in physical contact with said semiconductor device.

13. The thermal monitor of claim 1, in which said microprocessor means is coupled to said driving means to receive a signal therefrom as to whether or not said semiconductor device is operating.

14. Apparatus for preventing damage to a laser diode, comprising:
   a heat sink in physical contact with said semiconductor device;
   driving means for driving said laser diode;
   a photodiode enclosed in a common envelope with said laser diode for monitoring the light output of said laser diode, said photodiode being coupled to said driving means to control the output of the laser diode;
   switching means coupled to said driving means for applying and removing power to and from said driving means;
   temperature sensor means mounted in physical contact with said heat sink and capable of providing an analog electrical signal representative of the temperature sensed;
   amplifier means coupled to said temperature sensor means for amplifying the analog electrical signal provided by said temperature sensor means;

analog-to-digital converter means coupled to said amplifier means for converting the amplified analog signal to a digital value; and microprocessor means coupled to said analog-to-digital converter means and capable of selecting a proper duty cycle for operation of said laser diode, depending upon the temperature of said laser diode as given by said digital value, said microprocessor means being coupled to said switching means to control said switching means to cause said driving means to be operated in accordance with the selected duty cycle, said microprocessor means also being coupled to said driving means to receive a signal therefrom as to whether or not said laser diode is operating.

15. The apparatus of claim 14, in which the heat sink is of generally annular configuration.

16. The apparatus of claim 14, in which said switching means includes a power MOSFET transistor.

17. The apparatus of claim 14, in which the microprocessor means includes a look-up table which includes a plurality of temperature ranges and corresponding duty cycle values for selecting a duty cycle based upon the temperature data provided by the analog-to-digital converter means to the microprocessor means.

18. A method for preventing damage to a temperature-sensitive semiconductor device, comprising the following steps:
 (a) measuring the temperature of the temperature-sensitive semiconductor device to obtain temperature data;
 (b) converting said temperature data to digital form;
 (c) loading the digital temperature data into a microprocessor;
 (d) using said digital temperature data in the microprocessor to determine a duty factor; and
 (e) determining the operating time for said semiconductor device during a cycle by multiplying the total cycle time by the duty factor.

19. The method of claim 18, also including the following additional steps:
 (f) determining whether the system using the semiconductor device has been triggered to an "on" state;
 (g) if so, generating a power signal to cause said semiconductor device to be operated during that portion of an operating cycle determined by step (e); and
 (h) determining whether the operating cycle is complete and allowing no retriggering until said cycle has been completed.

20. The method of claim 18, in which said semiconductor device is a laser diode.

21. The method of claim 20, in which said laser diode includes an element for maintaining a constant light output from said laser diode.

22. The method of claim 18, in which the measurement of temperature data in step (a) is accomplished by generating an electrical signal representative of said temperature, and also including the step of amplifying said electrical signal before said temperature data is converted into digital form.

23. The method of claim 18, in which the determining of the operating time for the semiconductor device in step (e) is accomplished by use of a look-up table.

24. A method for operating a system which utilizes a temperature-sensitive semiconductor device, comprising the following steps:
 (a) applying power to the system;
 (b) carrying out a diagnostic test of the system and indicating a system failure if the system does not pass the test;
 (c) measuring the temperature of the temperature-sensitive semiconductor device to obtain temperature data;
 (d) converting said temperature data to digital form;
 (e) loading the digital temperature data into a microprocessor;
 (f) using said digital temperature data in the microprocessor to determine a duty factor;
 (g) determining the operating time for said semiconductor device during a cycle by multiplying the total cycle time by the duty factor;
 (h) determining whether the system utilizing the semiconductor device has been triggered to an "on" state;
 (i) if so, generating a power signal to cause said semiconductor device to be operated during that portion of an operating cycle determined by step (g); and
 (j) determining whether the operating cycle is complete and allowing no retriggering until said cycle has been completed.

25. The method of claim 24, in which the semiconductor device is a laser diode.

26. The method of claim 25, in which a light-sensitive element is associated with said laser diode for maintaining a constant light output therefrom.

27. The method of claim 24, in which the measurement of temperature data in step (c) is accomplished by generating an electrical signal representative of said temperature, and also including the step of amplifying said electrical signal before said temperature data is converted into digital form.

28. The method of claim 24, in which the determining of the operating time for the semiconductor device in step (g) is accomplished by use of a look-up table.

* * * * *